United States Patent
Holmes et al.

(10) Patent No.: US 7,362,412 B2
(45) Date of Patent: Apr. 22, 2008

(54) METHOD AND APPARATUS FOR CLEANING A SEMICONDUCTOR SUBSTRATE IN AN IMMERSION LITHOGRAPHY SYSTEM

(75) Inventors: Steven J. Holmes, Guilderland, NY (US); Mark C. Hakey, Fairfax, VT (US); Toshiharu Furukawa, Essex Junction, VT (US); David V. Horak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 551 days.

(21) Appl. No.: 10/904,601

(22) Filed: Nov. 18, 2004

(65) Prior Publication Data
US 2006/0103818 A1  May 18, 2006

(51) Int. Cl.
G03B 27/52 (2006.01)
G03B 27/42 (2006.01)
G03B 27/58 (2006.01)

(52) U.S. Cl. ............................ 355/30; 355/53; 355/72; 134/1.3

(58) Field of Classification Search ................ 355/30, 355/53, 72, 77; 134/1.3
See application file for complete search history.

(56) References Cited

U.S. PATENT DOCUMENTS

| 6,770,424 B2 | 8/2004 | Mandal et al. |
| 6,809,794 B1 | 10/2004 | Sewell |
| 7,119,874 B2 * | 10/2006 | Cox et al. ..................... 355/30 |
| 2003/0075204 A1 | 4/2003 | de Larios et al. |
| 2004/0060195 A1 | 4/2004 | Garcia et al. |
| 2004/0060580 A1 | 4/2004 | Woods |
| 2004/0067860 A1 | 4/2004 | Lee |
| 2004/0069319 A1 | 4/2004 | Boyd et al. |
| 2004/0069329 A1 | 4/2004 | de Larios et al. |
| 2004/0136494 A1 | 7/2004 | Lof et al. |
| 2004/0160582 A1 | 8/2004 | Lof et al. |
| 2004/0207824 A1 | 10/2004 | Lof et al. |
| 2004/0211920 A1 | 10/2004 | Derksen et al. |
| 2005/0259234 A1 * | 11/2005 | Hirukawa et al. ............ 355/53 |
| 2006/0038968 A1 * | 2/2006 | Kemper et al. ............... 355/18 |

FOREIGN PATENT DOCUMENTS

WO   WO 2004/053955 A1 *  6/2004

OTHER PUBLICATIONS

"Status ASML Immersion"; by Donis Flagello, Jan Mulkens presented at SPIE Microlithography Symposium, Feb. 22, 2004.
Mulkens et al.; Benefits and limitations of immersion lithography; Society of Photo-Optical Instrumentation Engineers; pp. 104-114, Jan. 2004.

* cited by examiner

Primary Examiner—Alan A Mathews
(74) Attorney, Agent, or Firm—Schmeiser, Olsen & Watts; Steven Capella

(57) ABSTRACT

A method and apparatus for reduction and prevention of residue formation and removal of residues formed in an immersion lithography tool. The apparatus including incorporation of a cleaning mechanism within the immersion head of an immersion lithographic system or including a cleaning mechanism in a cleaning station of an immersion lithographic system.

26 Claims, 10 Drawing Sheets

METHOD AND APPARATUS FOR CLEANING A SEMICONDUCTOR SUBSTRATE IN AN IMMERSION LITHOGRAPHY SYSTEM

BACKGROUND OF THE INVENTION

Field of the Invention

The present invention relates to the field of semiconductor manufacturing processes; more specifically, it relates to method and apparatus for cleaning a semiconductor substrate in an immersion lithography system.

Immersion lithography is emerging as a technology for extending optical photolithography to smaller image sizes than currently printable with conventional optical lithography tools. Immersion lithography tools place an immersion liquid in direct contact with the photoresist layer to be exposed and the final image-focusing lens of the immersion lithography system is either immersed in the liquid or placed in very close proximity to the immersion liquid. The immersion liquid allows an increase of the capture angle of the Raleigh criterion of resolution (thus increasing resolution) by application of Snell's law of refraction and thus smaller images can be formed than could otherwise be possible in lithography systems with only air between the photoresist layer and the final image-focusing lens.

However, a significant problem with immersion lithography is the creation of contaminant residues on the photoresist surface and on the surface of the semiconductor substrate in regions where the photoresist is subsequently developed away. These residues can cause physical yield and reliability defects as well as degradation of electrical parameters of the integrated circuit devices being fabricated.

Therefore, there is a need for a method and apparatus for preventing or reducing formation of contaminant residues and for removing contaminant residues formed during immersion lithography.

SUMMARY OF THE INVENTION

The present invention addresses the problem of reduction or prevention of contaminant residue formation and removal of contaminant residues formed in an immersion lithography tool by in situ cleaning of the semiconductor substrate by incorporation of a cleaning mechanism within the immersion head of an immersion lithographic system or by incorporation of a cleaning mechanism in a cleaning station of an immersion lithographic system.

A first aspect of the present invention is an apparatus, comprising: a chamber having a top and a sidewall and a bottom opening, the top transparent to selected wavelengths of light; an inlet and an outlet in the sidewall of the chamber; a plate extending outward from a bottom edge of the chamber; a set of concentric grooves formed in a bottom surface of the plate, the grooves centered about the chamber, means for applying a vacuum to a first groove and a fourth groove of the set of grooves, the first groove nearest the bottom opening of the chamber; means for supplying an inert gas or the inert gas and a solvent vapor mixture to a second groove and a fifth groove of the set of grooves, the second groove between the first and the fourth groove and the fifth groove outside of the fourth groove; and means for supplying a cleaning fluid to a third groove of the set of grooves, the third groove between the second groove and the fourth groove.

A second aspect of the present invention is an apparatus, comprising: a circular plate and a opening formed in bottom surface of the plate; a set of concentric grooves formed in the bottom surface of the plate, the grooves centered about the opening; means for supplying a cleaning fluid to the opening; means for applying a vacuum to a first groove of the set of grooves, the first groove closest to the opening; and means for supplying an inert gas or the inert gas and a solvent vapor mixture to a second groove of the set of grooves, the second groove outside of the first groove.

A third aspect of the present invention is an immersion exposure system for exposing a photoresist layer on a top surface of a wafer to light, comprising: a light source, one or more focusing lenses, a mask holder, a slit, an immersion head and a wafer stage, the light source, the one or more focusing lenses, the mask holder, the slit, and the immersion head aligned to an optical axis, the wafer stage moveable in two different orthogonal directions, each the orthogonal direction orthogonal to the optical axis, the mask holder and the slit moveable in one of the two orthogonal directions, the immersion head having a chamber having a top, a sidewall and a bottom opening, the top transparent to selected wavelengths of light; means for filling the chamber of the immersion head with an immersion liquid, the chamber aligned to the optical axis; and means for cleaning a top surface of the photoresist layer.

A fourth aspect of the present invention is a method for exposing a photoresist layer on a top surface of a wafer to light, comprising: (a) placing a portion of a top surface of the photoresist layer in contact with an immersion liquid and forming regions of exposed and unexposed photoresist in the portion of the photoresist layer; after (a), (b) removing any immersion liquid remaining on the top surface of the portion of the photoresist layer; after (b), (c) rinsing the top surface of the portion of the photoresist layer with an inert gas or the inert gas and a solvent vapor mixture; after (c), (d) cleaning the top surface of the portion of the photoresist layer with a cleaning fluid; after (d), (e) removing the cleaning fluid; and after (e), (f) rinsing the top surface of the portion of the photoresist layer with an additional inert gas or the additional inert gas and an additional solvent vapor mixture.

BRIEF DESCRIPTION OF DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION OF THE INVENTION

For the purpose of the present invention the term wafer will be used to indicate any semiconductor substrate, examples of which include but are not limited to bulk silicon substrates, silicon-on-insulator (SOI) substrates, silicon-germanium substrates, sapphire substrates, and other semiconductor substrates used for the manufacturing of integrated circuits.

Figure 1:
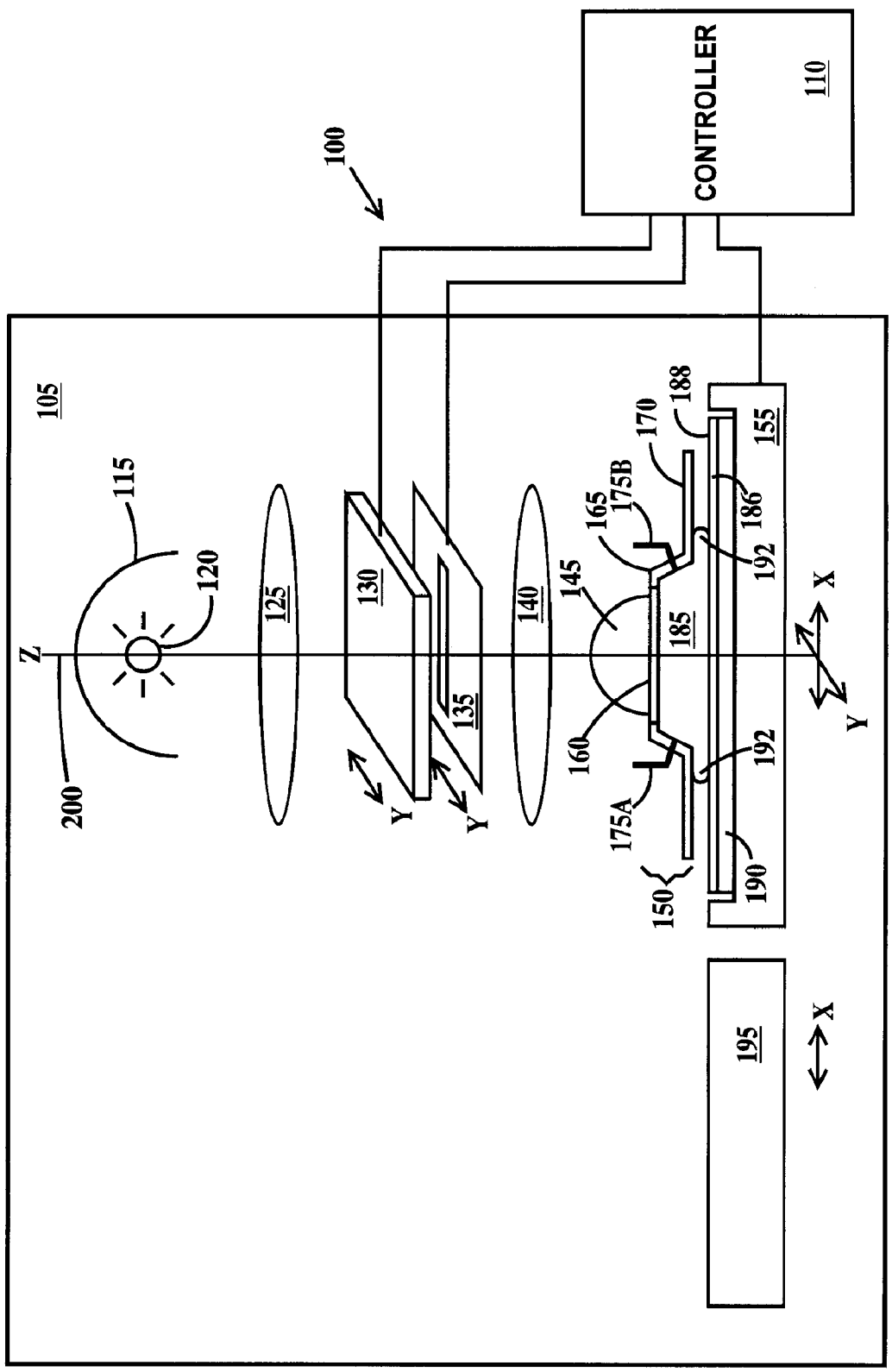
FIG. 1 is a pictorial representation of an exemplary immersion lithography system according to a first embodiment of the present invention.

FIG. 1 is a pictorial representation of an exemplary immersion lithography system according to a first embodiment of the present invention. In FIG. 1, an immersion lithography system 100 includes a controlled environment chamber 105 and a controller 110. Contained within controlled environment chamber 105 is a focusing mirror 115, a light source 120, a first focusing lens (or set of lenses) 125, a mask 130, an exposure slit 135, a second focusing lens (or set of lenses) 140, a final focusing lens 145, an immersion head 150 and a wafer chuck 155. Immersion head 150 includes a transparent window 160, a central chamber portion 165, a surrounding plate portion 170, an immersion liquid inlet 175A and an immersion liquid outlet 175B. An immersion liquid 185 fills central chamber portion 165 and contacts a photoresist layer 186 on a top surface 188 of a wafer 190. Plate portion 170 is positioned close enough to photoresist layer 186 to form a meniscus 192 under plate portion 170. Window 160 must be transparent to the wavelength of light selected to expose photoresist layer 186. In one example window 160 is transparent to a wavelength of about 190 nm or less.

Focusing mirror 115, light source 120, first focusing lens 125, a mask 130, exposure slit 135, second focusing lens 140, final focusing lens 145, immersion head 150 are all aligned along an optical axis 200 which also defines a Z direction. An X direction is defined as a direction orthogonal to the Z direction and in the plane of the drawing. A Y direction is defined as a direction orthogonal to both the X and Z directions. Wafer chuck 155 may be moved in the X and Y directions under the direction of controller 110 to allow formation of regions of exposed and unexposed photoresist in photoresist layer 186. As XY-stage moves, new portions of photoresist layer 186 are brought into contact with immersion liquid 185 and previously immersed portions of the photoresist layer are removed from contact with the immersion liquid. Mask 130 and slit 135 may be moved in the Y direction under the control of controller 110 to scan the image (not shown) on mask 130 onto photoresist layer 186. In one example, the image on mask 130 is a 1× to a 10× magnification version of the image to be printed and includes one or multiple integrated circuit chip images.

When exposure is complete, wafer 190 must be removed from controlled environment chamber 105 without spilling immersion fluid 185. To this end, controlled environment chamber 105 also includes a cover plate 195 that may be moved to first abut with wafer chuck 155 and then move with the wafer chuck as the wafer chuck is moved out of position from under immersion head 150, the cover plate replacing the wafer chuck under immersion head 150.

Figure 2:
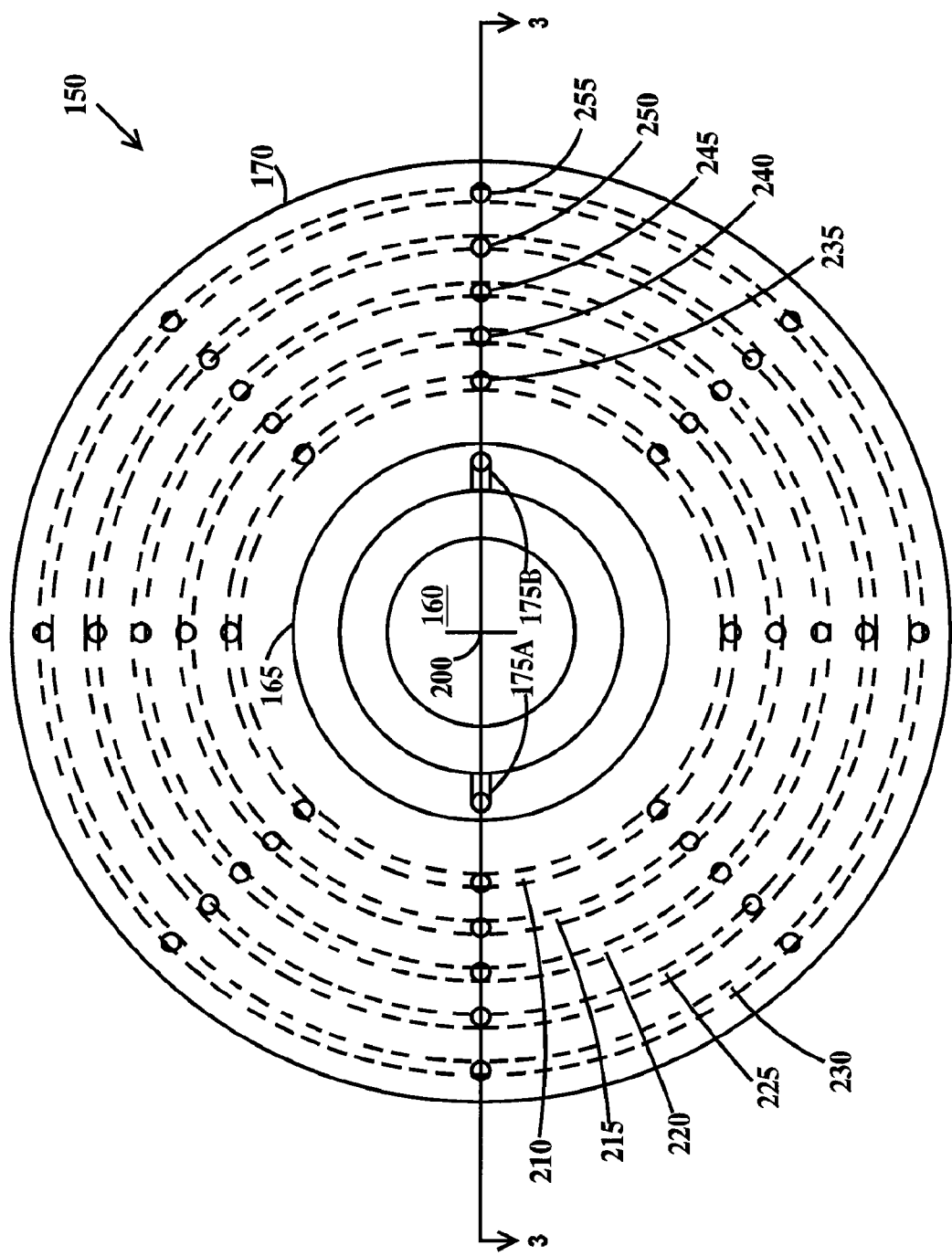
FIG. 2 is a top view of a first immersion head for use in the immersion lithography system of FIG. 1 according to the present invention.

FIG. 2 is a top view of a first immersion head for use in the immersion lithography system of FIG. 1 according to the present invention. In FIG. 2, plate portion 170 of immersion head 150 contains concentric circular grooves 210, 215, 220, 225 and 230 formed into a bottom surface of the plate portion. Each circular groove is open to multiple inlets or outlets evenly positioned along the groove. Groove 210 is connected to outlets 235. Groove 215 is connected to inlets 240. Groove 220 is connected to inlets 245. Groove 225 is connected to outlets 250. Groove 230 is connected to inlets 255.

Figure 3:
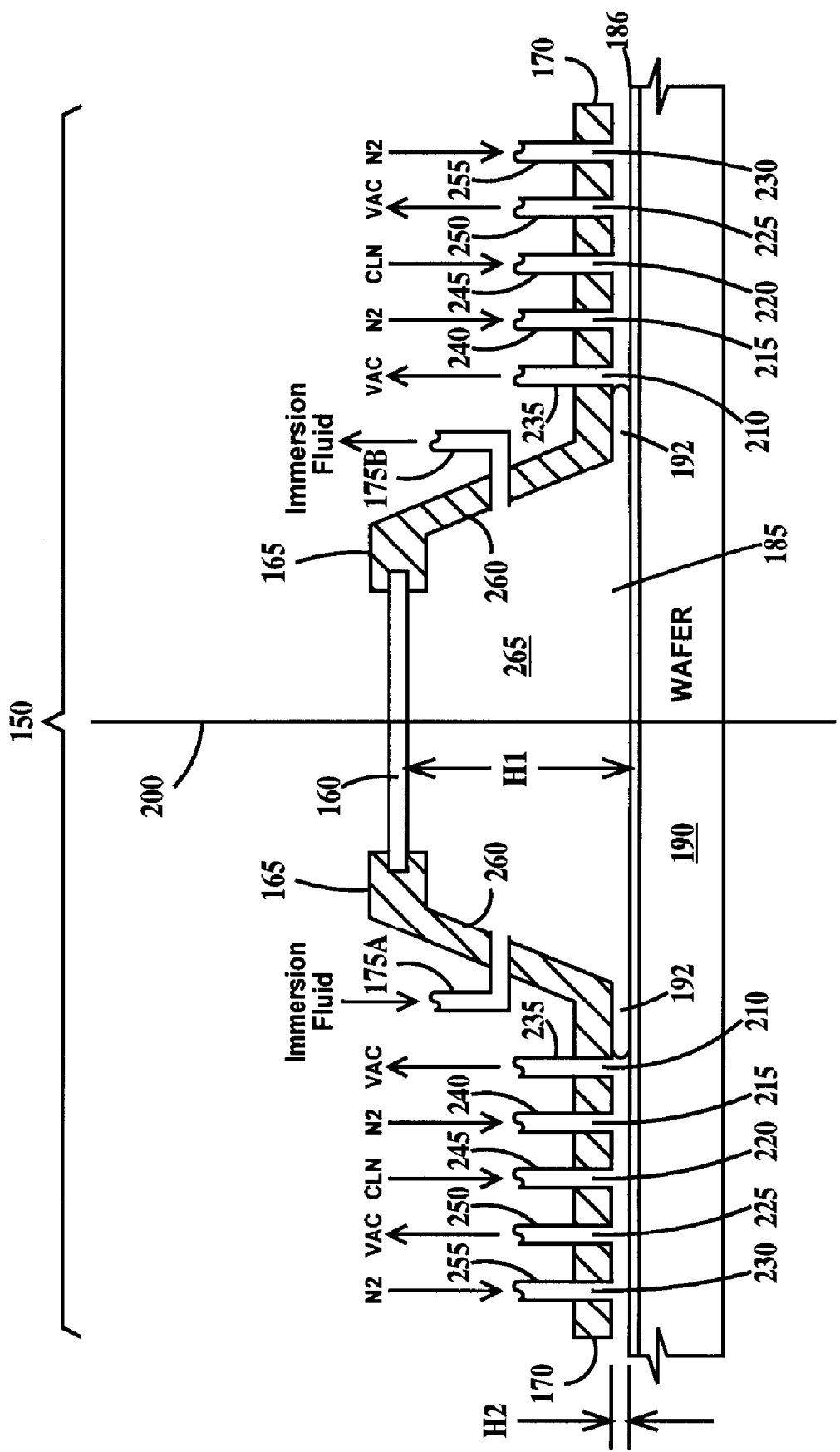
FIG. 3 is a cross-sectional view through line 3-3 of FIG. 2.

FIG. 3 is a cross-sectional view through line 3-3 of FIG. 2. In FIG. 3, window 160, sidewall 260 of chamber portion 165 of immersion head 150 and photoresist layer 186 define an immersion chamber 265 having a height H1 in which the bulk of immersion liquid 185 is contained. Plate portion 170 of immersion head 186 is positioned a height H2 above photoresist layer 186. In one example H1 is about 1 to about 5 mm. In one example H2 is about 5 to about 100 microns. A small portion of immersion fluid 185 is contained in meniscus 192 between plate portion 170, photoresist layer 186 and groove 210.

Groove 210 is the innermost groove of grooves 210, 215, 220, 225 and 230 relative to chamber portion 165 and outlets 235 are connected to a vacuum source. Groove 215 is positioned outside of groove 210 relative to chamber portion 165 and inlets 240 supply, to groove 215, an inert gas such as nitrogen or an inert gas/solvent vapor mixture such as a nitrogen and methanol vapor mixture, a nitrogen ethanol vapor mixture or a nitrogen and propanol or isopropanol vapor mixture which is dispersed on photoresist layer 186. Other inert gases may be substituted for nitrogen and other organic solvents may be substituted for methanol, ethanol and propanol or isopropanol. Groove 210 collects any immersion liquid 185 leaking past meniscus 192 or left on photoresist layer 186 as well as the inert gases or inert gases/solvent vapor mixtures dispersed on photoresist layer 186 from groove 220.

Groove 220 is positioned outside of groove 215 relative to chamber portion 165 and inlets 245 supply a cleaning fluid to groove 225 that then is dispersed onto photoresist layer 186. Thus groove 220 may be considered a "cleaning" groove. The cleaning fluid may be selected based on the composition of immersion liquid 185 and photoresist layer 186. In a first example, if immersion liquid 185 is water or a water based material, then the cleaning fluid may comprise, a polar solvent, a chelating agent, a hydroxylamine, an alkanolamine and combinations thereof. Examples of chelating agents include, but are not limited to organic acids, thiophenol, ethylene diamine teracarboxylic acid, ethylene diamine tetra acetic acid, hydroxybenzene and derivatives thereof. Examples of polar solvents include but are not limited to water, alcohols, glycols and glycol ethers.

In a second example, if immersion fluid 185 is a glycerol, then the cleaning fluid may comprise an alcohol. Examples of alcohols include but are not limited to methanol, ethanol, propanol or isopropanol.

In a third example, if immersion fluid 185 is oil based, then the cleaning fluid may comprise a non-polar solvent. Examples of non-polar solvents include but are not limited to alkanes, cyclic alkanes and alkenes, ketones, and chlorinated solvents.

Groove 225 is positioned outside of groove 220 relative to chamber portion 165 and outlets 250 are connected to a vacuum source. Groove 230 is positioned outside of groove 225 relative to chamber portion 165 and inlets 255 supply, to groove 230, an inert gas such as nitrogen or an inert gas/solvent vapor mixture such as a nitrogen and methanol vapor mixture, a nitrogen ethanol vapor mixture or a nitrogen and propanol or isopropanol vapor mixture which contacts photoresist layer 186. Other inert gases may be substituted for nitrogen and other organic solvents may be substituted for methanol, ethanol propanol and isopropanol. Groove 225 collects cleaning fluid dispersed onto photoresist layer 186 from groove 220 as well as the inert gases or inert gases/solvent vapor mixtures dispersed on photoresist layer 186 from groove 230.

As wafer 190 is moved under immersion head 150 during exposure, immersion fluid 185 is constantly circulated through immersion chamber 265 from inlet 175A to outlet 175B. Simultaneously inert gases or inert gas/solvent vapor mixtures are supplied by inlets 240 and 255 to grooves 215 and 225 respectively and dispersed on photoresist layer 186, cleaning fluid is supplied to groove 220 by inlets 245 dispersed on photoresist layer 186 and vacuum is applied to grooves 210 and 225 by outlets 235 and 250 respectively to remove cleaning fluid and inert gases or inert gases and solvent vapor mixtures. Thus fresh cleaning fluid and inert gases or inert gas/solvent vapor mixtures are constantly being applied to and removed from photoresist layer 186 before and after immersion and exposure of the photoresist layer. The photoresist surface is thus cleaned of any contaminants attaching to it from the immersion fluid and the contaminants are removed in a very short period of time after exposure to immersion fluid. Additionally, by cleaning the surface of photoresist later 186 before the surface come into contact with immersion fluid 185, potential contamination of the immersion fluid is reduced or eliminated.

Temperature control in an immersion lithography system is important. Therefore, the ambient atmosphere of controlled environment chamber 105, immersion fluid 185, all inert gases or inert gas/solvent vapor mixtures and all cleaning fluids supplied to grooves 210, 215, 225 and 230 in plate portion 170 of immersion head 150 are temperature controlled. In one example, the ambient atmosphere of controlled environment chamber 105, immersion fluid 185, all inert gases or inert gas/solvent vapor mixtures are controlled to room temperature (about 18° C. to about 24° C.) plus or minus about 0.1° C. by any number of means well known in the art. Additionally the humidity of controlled environment chamber 105 may be controlled to about 40% relative humidity or less. And all non-aqueous inert gas/solvent mixtures and cleaning fluids may be selected or treated to contain less than about 1% water by weight.

Figure 4:
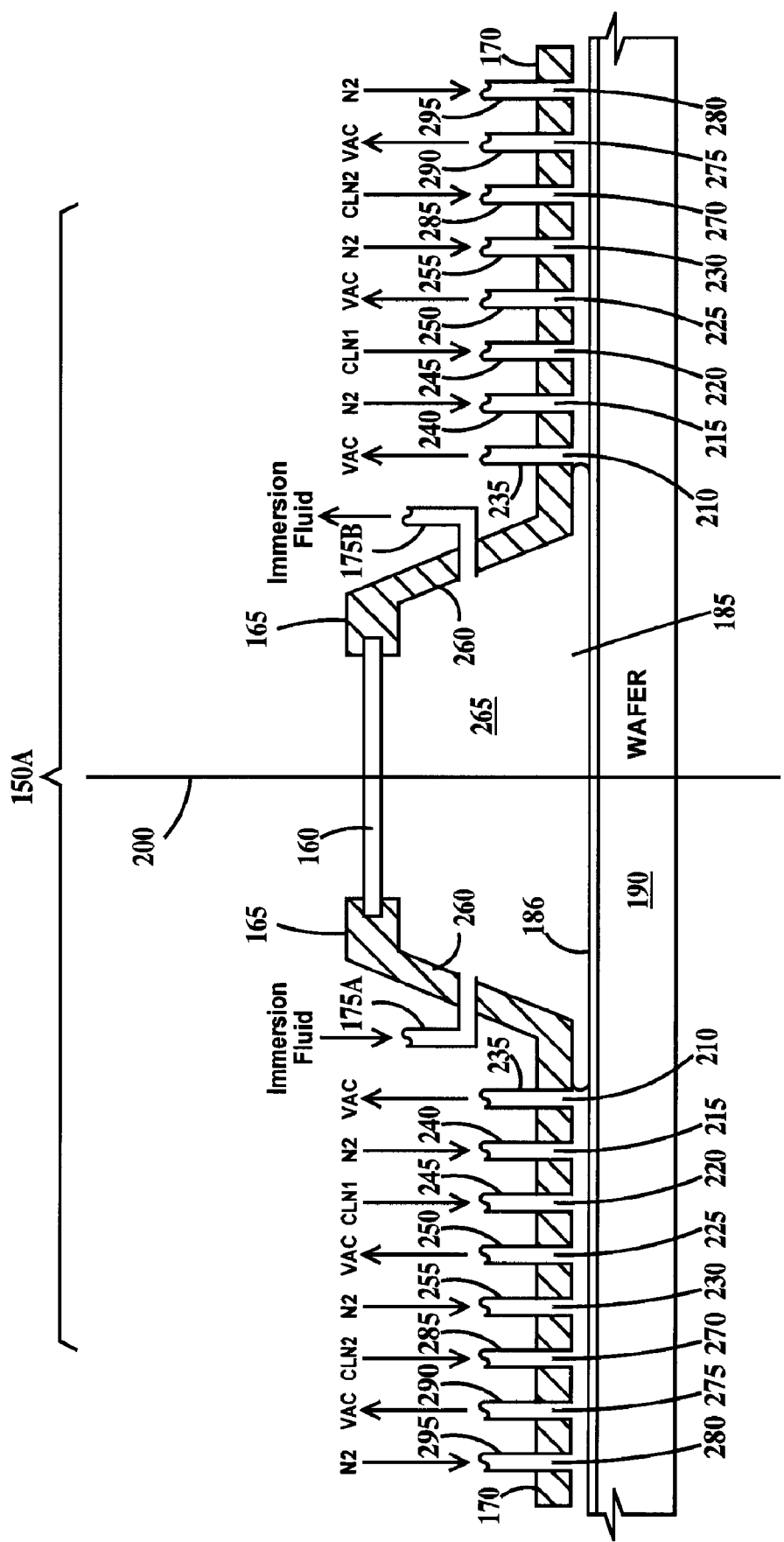
FIG. 4 is a cross-sectional view of a second immersion head for use in the immersion lithography system of FIG. 1 according to the present invention.

FIG. 4 is a cross-sectional view of a second immersion head for use in the immersion lithography system of FIG. 1 according to the present invention. In FIG. 4, an immersion head 150A is similar to immersion head 150 of FIGS. 2 and 3 except that additional grooves 270, 275 and 280 and corresponding sets of inlets 285, outlets 290 and inlets 295 are added to plate portion 170.

Groove 270 is positioned outside of groove 230 relative to chamber portion 165 and inlets 285 supply a second cleaning fluid to groove 270 that is dispersed on photoresist layer 186. Thus groove 270 may be considered a "cleaning" groove. The cleaning fluid may be selected based on the composition of immersion liquid 185 and the first cleaning fluid being supplied to groove 220 by inlets 245. The second cleaning fluid may comprise any of the cleaning fluids described supra in reference to groove 220 or may comprise any of the inert gas or inert gas/solvent vapor mixtures described supra in reference to grooves 215 and 230. Groove 275 is positioned outside of groove 270 relative to chamber portion 165 and outlets 290 are connected to a vacuum source. Groove 280 is positioned outside of groove 275 relative to chamber portion 165 and inlets 295 supply any of the inert gases or inert gases/solvent vapor mixtures described supra.

Figure 5:
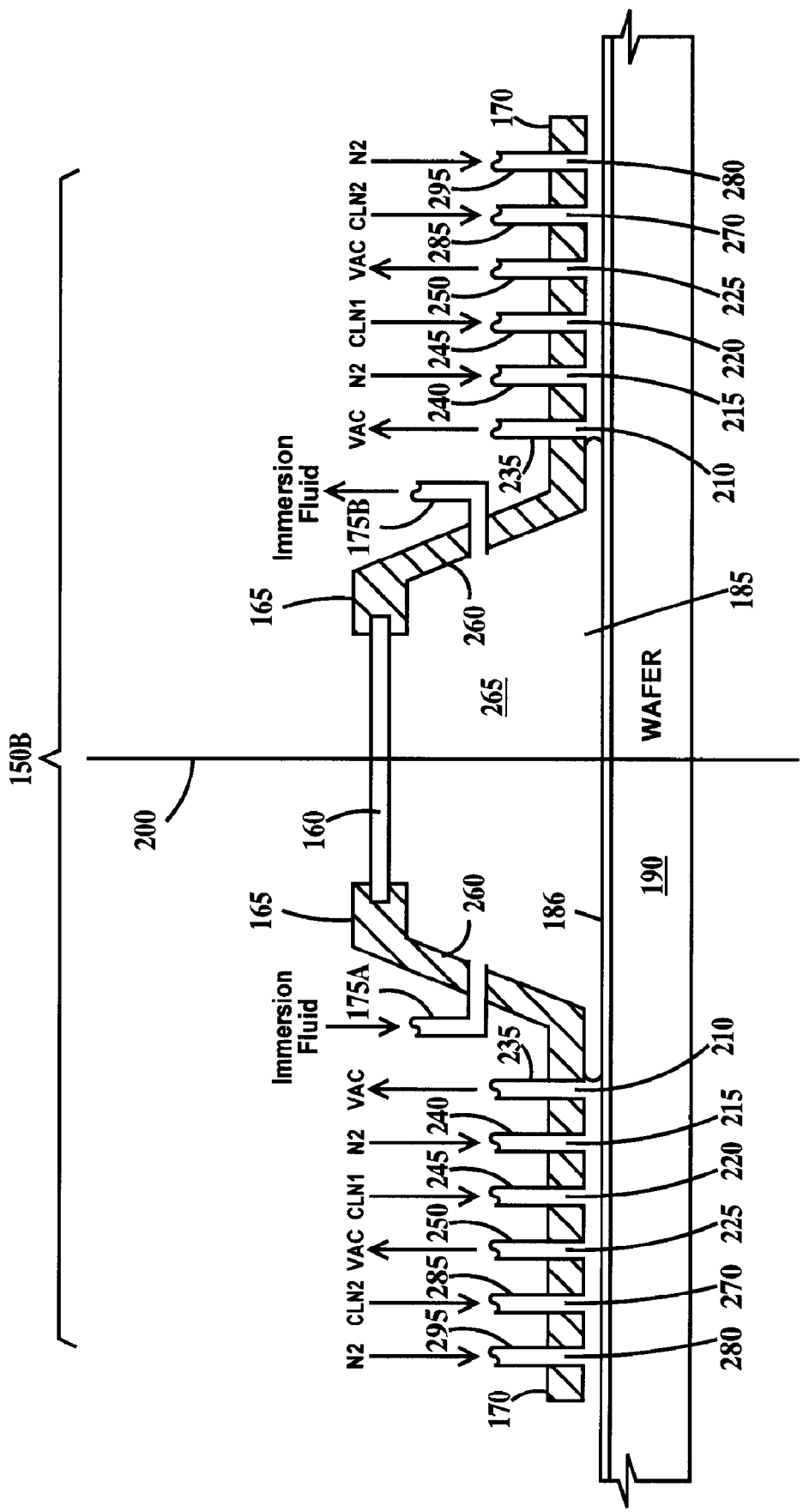
FIG. 5 is a cross-sectional view of a third immersion head for use in the immersion lithography system of FIG. 1 according to the present invention.

FIG. 5 is a cross-sectional view of a third immersion head for use in the immersion lithography system of FIG. 1 according to the present invention. In FIG. 5, an immersion head 150B is similar to immersion head 150A of FIG. 4 except that grooves 230 and 275 and corresponding inlets 255 and outlets 290 are eliminated. This embodiment of the present invention is useful when the first and second cleaning fluids supplied by inlets 245 and 285 do not form any harmful reaction products and can both be allowed to be captured in groove 225 and removed through outlets 250.

In a first mode of operation, cleaning fluid is supplied to groove 220 for immersion heads 150 (see FIG. 3), immersion head 150A (see FIG. 4) and immersion head 150B (see FIG. 5) and to groove 270 for immersion heads 150A and 150B at all times during exposure of photoresist layer 186. In a second mode of operation, cleaning fluid is supplied to groove 220 for immersion heads 150 (see FIG. 3), immersion head 150A (see FIG. 4) and immersion head 150B (see FIG. 5) and to groove 270 for immersion heads 150A and 150B only when wafer 190 is moving relative to immersion head 150, 150A or 150B as the case may be.

Figure 6:
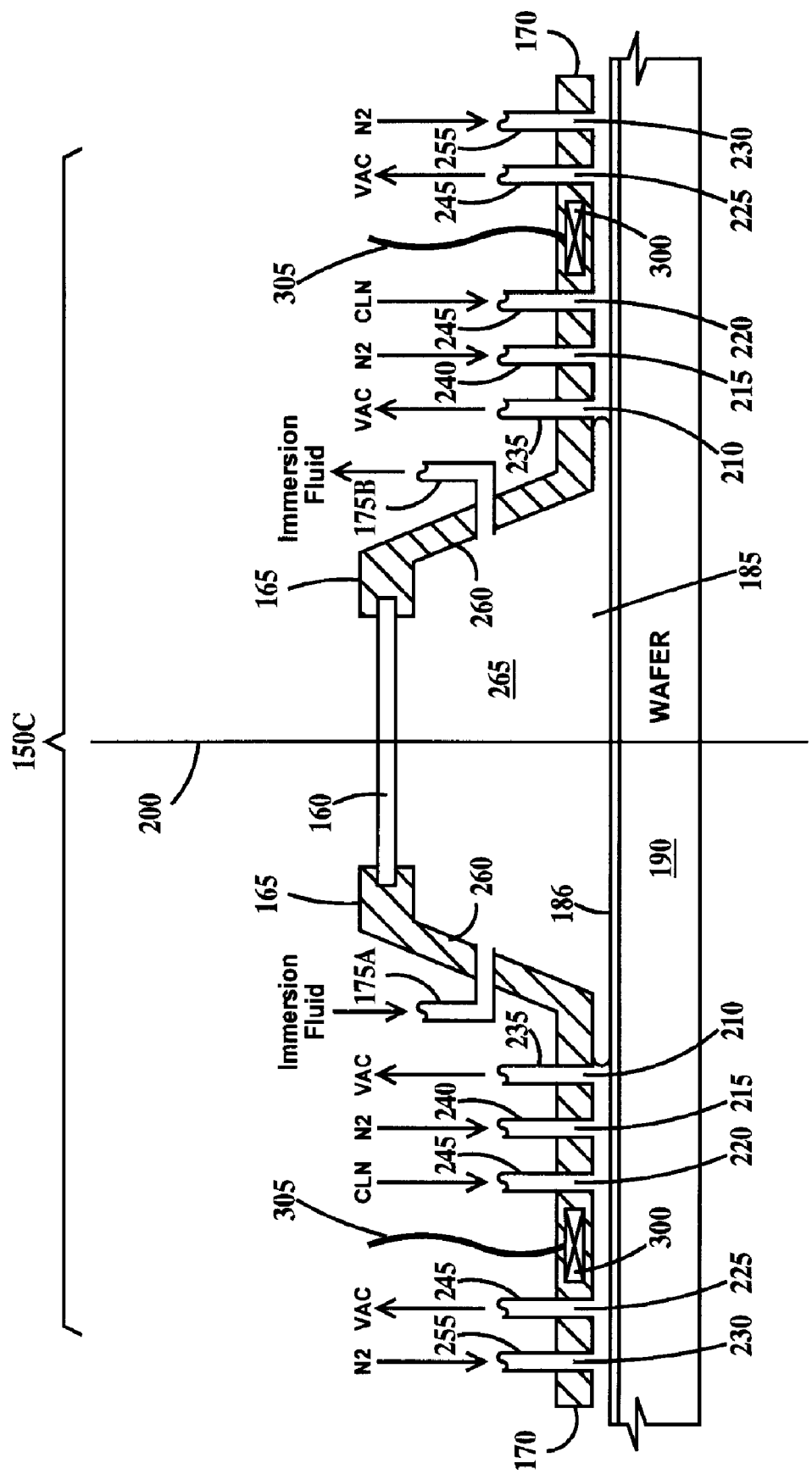
FIG. 6 is cross-sectional view of a fourth immersion head for use in the immersion lithography system of FIG. 1 according to the present invention.

FIG. 6 is cross-sectional view of a fourth immersion head for use in the immersion lithography system of FIG. 1 according to the present invention. In FIG. 6, an immersion head 150C is similar to immersion head 150 of FIGS. 2 and 3 except a set of ultrasonic generators 300 are positioned between grooves 220 and 225. Radio frequency (RF) power is supplied to each ultrasonic generator 300 by RF cables 305. Cleaning fluid dispersed from groove 220 onto photoresist layer 186 passes under ultrasonic generators 300 before being captured and removed by grooves 225. The ultrasonic energy supplied by ultrasonic generators aids in removing contaminants from photoresist layer 186. In a third mode of operation, ultrasonic generators are powered whenever cleaning fluid is supplied to groove 220. In a fourth mode of operation, ultrasonic energy is only supplied when cleaning fluid is supplied to groove 220 and wafer 190 is moving relative to immersion head 150C. In a fifth mode of operation ultrasonic generators 300 are not used.

Figure 7:
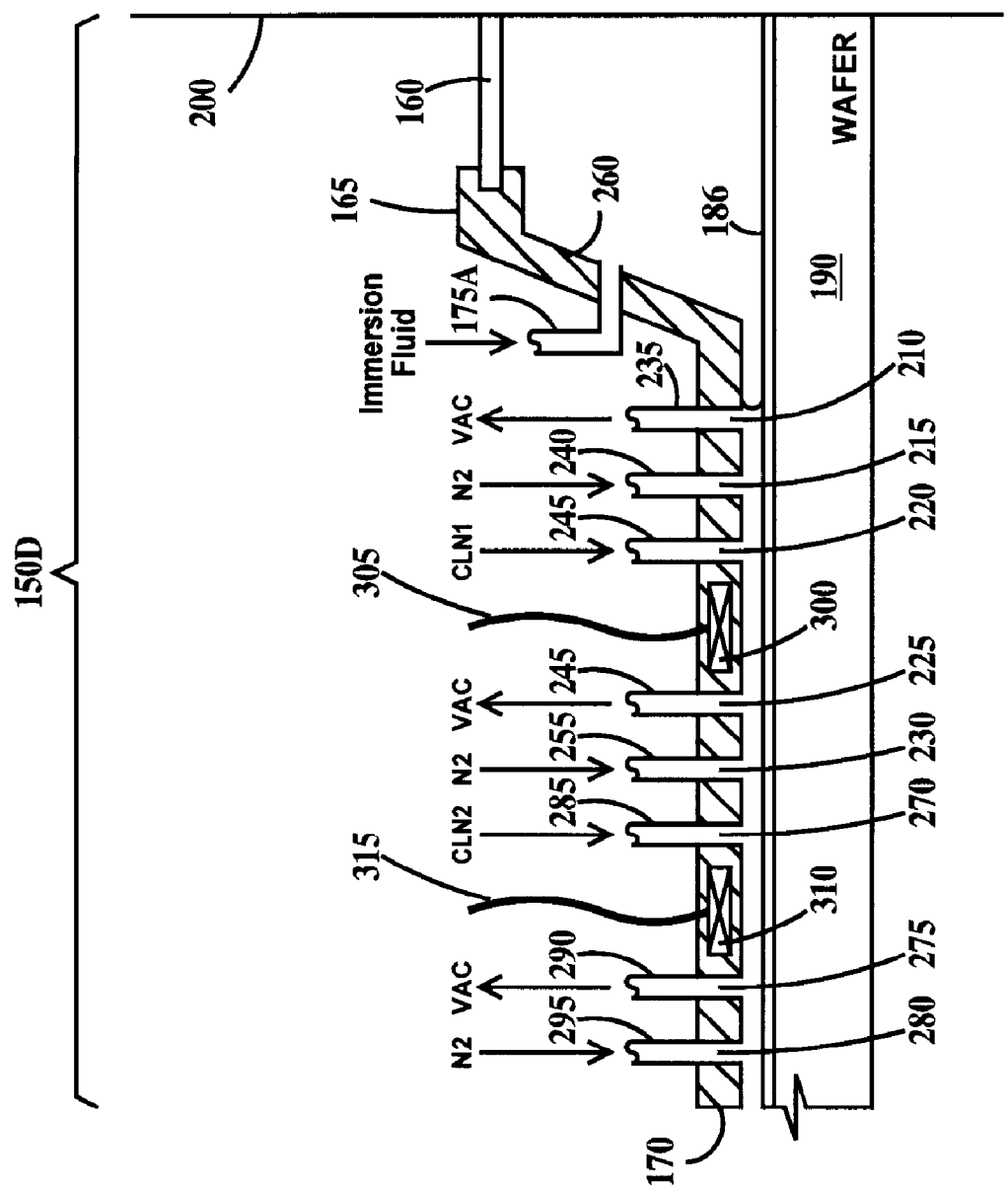
FIG. 7 is a partial cross-sectional view of a fifth immersion head for use in the immersion lithography system of FIG. 1 according to the present invention.

FIG. 7 is a partial cross-sectional view of a sixth immersion head for use in the immersion lithography system of FIG. 1 according to the present invention. In FIG. 7, an immersion head 150D is similar to immersion head 150C of FIG. 6 except a second set of ultrasonic generators 310 are positioned between grooves 270 and 275. RF power is supplied to each ultrasonic generator 310 by RF cables 315. Cleaning fluid dispersed from groove 270 onto photoresist layer 186 passes under ultrasonic generators 310 before being captured and removed by grooves 275. The ultrasonic energy supplied by ultrasonic generators aids in removing contaminants from photoresist layer 186. In a sixth mode of operation, ultrasonic generators are powered whenever cleaning fluid is supplied to groove 270. In a seventh mode of operation, ultrasonic energy is only supplied when cleaning fluid is supplied to groove 270 and wafer 190 is moving relative to immersion head 150D. In an eighth mode of operation ultrasonic generators 310 are not used.

In FIGS. 6 and 7, ultrasonic generators 300 and 310 are shown imbedded in plate 170. Ultrasonic generators 300 and 310 may be placed in slots formed in the bottom surface of plate 170, in slots formed in a top surface of plate 170, or simply positioned on top surface 170.

Any combination of mode 1 or 2, and/or mode 3, 4 or 5, and/or mode 6, 7 or 8 may be employed in the operation of an immersion head according to the present invention, provided that the mode(s) selected is supported by the physical immersion head fitted to the immersion lithography system.

Returning to FIG. 5, ultrasonic generators (not shown) can be added to immersion head 150B between grooves 220 and 225, between grooves 270 and 280 or between both grooves 220 and 225 and between grooves 270 and 280.

Figure 8:
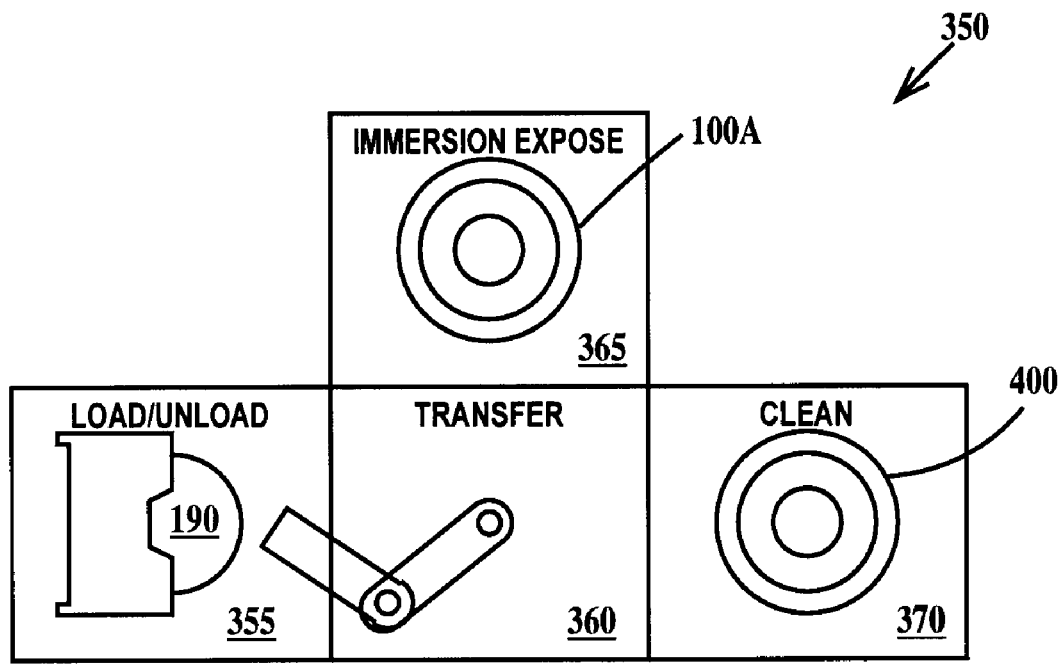
FIGS. 8 and 9 are pictorial representations of an immersion lithography system according to a second embodiment of the present invent.
Figure 9:
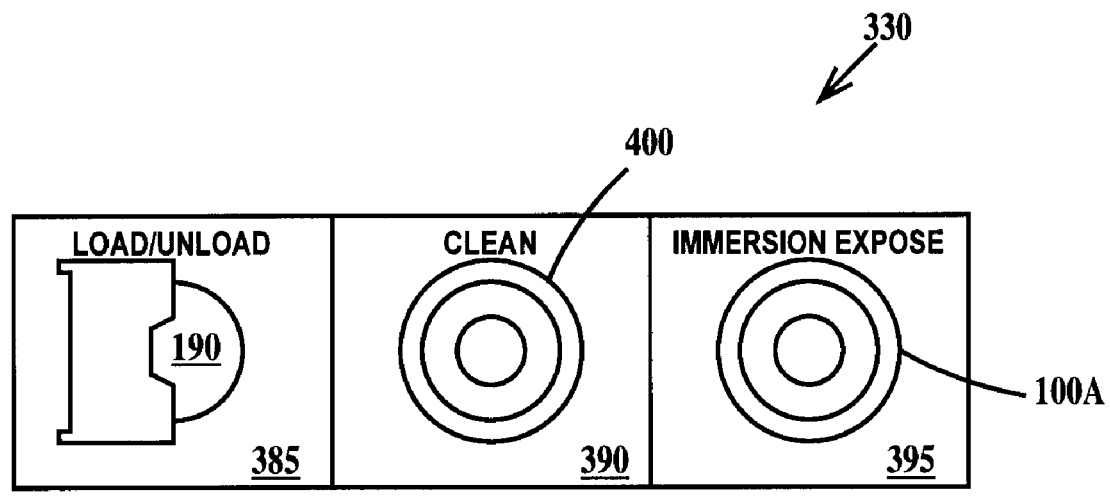

FIGS. 8 and 9 are pictorial representations of an immersion lithography system according to a second embodiment of the present invention. In FIG. 8, a photolithography exposure tool 350 includes a load/unload station 355, a wafer transfer station 360, an immersion lithography station 365 and a cleaning station 370. Immersion lithography station 365 includes an immersion lithography system 100A. Immersion lithography system 100A is similar to immersion lithography system 100 of FIG. 1 described supra, except that the immersion head of immersion lithography system 100A is a conventional immersion head. Alternatively, the immersion head of immersion lithography system 100A may be an immersion head according to the present invention. Clean station 370, includes a cleaning head 400 illustrated in FIG. 10 and described infra. In FIG. 9, a photolithography exposure tool 380 includes a load/unload station 385, a cleaning station 390 and an immersion lithography station 395. Immersion lithography station 395 includes immersion lithography system 100A.

Figure 10:
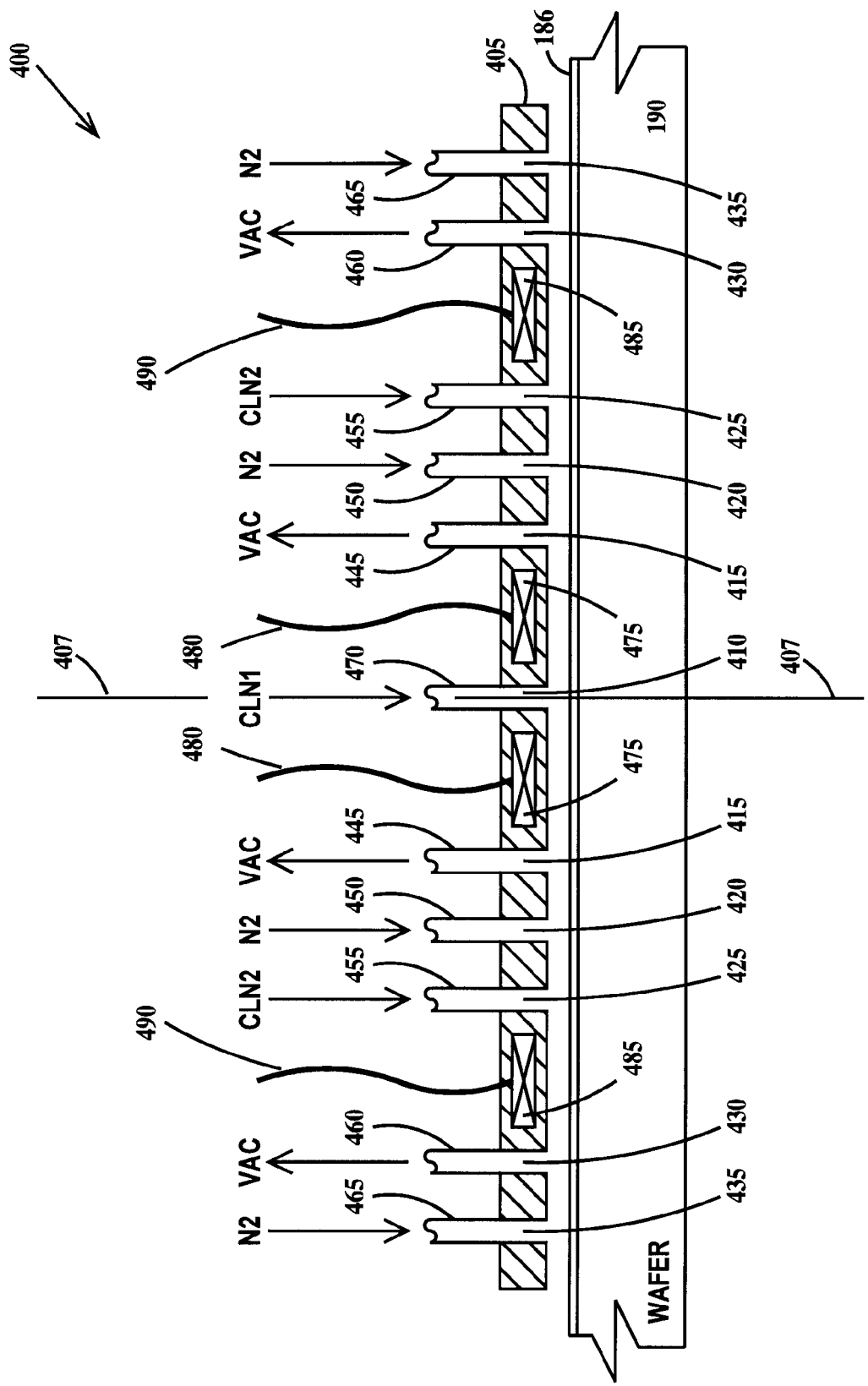
FIG. 10 is a cross-sectional view of a first immersion head for use in the immersion lithography system of FIGS. 8 and 9 according to the present invention.

FIG. 10 is a cross-sectional view of a first immersion head for use in the immersion lithography system of FIGS. 8 and 9 according to the present invention. In FIG. 10, a cleaning head 400 contains no immersion chamber but includes a circular plate 405 symmetrical about a longitudinal axis 407 and having a central opening 410 aligned with axis 407 and containing concentric circular grooves 415 and 420 and optional grooves 425, 430 and 435 formed into a bottom surface of the plate. Each circular groove is open to multiple inlets or outlets evenly positioned along the groove. Groove 415 is connected to outlets 445. Groove 420 is connected to inlets 450. Groove 425 is connected to inlets 455. Groove 430 is connected to outlets 460. Groove 435 is optional. A set of ultrasonic generators 475 are positioned in plate 405 between central opening 410 and groove 415. RF power is supplied to each ultrasonic generator 475 by RF cables 480. A second optional set of ultrasonic generators 485 are positioned in plate 405 between groove 425 and groove 430. RF power is supplied to each ultrasonic generator 485 by RF cables 490.

Central opening 410 is supplied with a first cleaning fluid by inlet 470. Thus central opening 410 may be considered a "cleaning" opening. In a first example, first cleaning fluid comprises a polar solvent, a chelating agent, a hydroxy-lamine, an alkanolamine and combinations thereof. Examples of chelating agents include, but are not limited to ethylene diamine, ethylene diamine tetra-acetate (EDTA), ethylene glycol-bis-(2-aminoethyl)-N,N,N'N'-tetra-acetate (EGTA), tris-carboxymethylamine, nitrilo-acetic acid, nitrilo-acetate, citrates, tartrates, triethanol-amine, salicylic acid, dimercaptopropanol, phosphates, polysaccharides, and carbohydrates. Examples of polar solvents include but are not limited to water, alcohols, glycols and glycol ethers. In a second example, first cleaning fluid comprises an alcohol. Examples of alcohols include but are not limited to methanol, ethanol, propanol and isopropanol. In a third example, first cleaning fluid comprises a non-polar solvent. Examples of non-polar solvents include but are not limited to non-polar solvents such as alkanes, cyclic alkanes and alkenes, ketones, and chlorinated solvents.

Groove 415 is the innermost groove of grooves 415, 420, 425, 430, and 435 relative to central opening 410 and outlets 445 are connected to a vacuum source. Cleaning fluid dispersed from central opening 410 onto photoresist layer 186 passes under ultrasonic generators 475 before being captured and removed by grooves 415. Groove 420 is positioned outside of groove 415 relative to central opening 410 and inlets 450 supply, to groove 420, an inert gas or inert gas/solvent vapor mixture such as those described supra which is dispersed on photoresist layer 186.

Groove 425 is positioned outside of groove 420 relative to central opening 410 and inlets 455 supply a second cleaning fluid to groove 425 that is dispersed on photoresist layer 186. Thus groove 425 may be considered a "cleaning" groove. In one example, the second cleaning fluid may comprise any of the cleaning fluids described supra or may comprise any of the inert gas or inert gas/solvent vapor mixtures described supra. Groove 430 is positioned outside of grooves 425 relative to central opening 410 and outlets 460 are connected to a vacuum source. Cleaning fluid dispersed from groove 425 onto photoresist layer 186 passes under ultrasonic generators 485 before be captured and removed by grooves 430. Groove 435 is positioned outside of groove 430 relative to central opening 410 and inlets 465 supply, to groove 430, an inert gas or insert gas/solvent vapor mixture such as those described supra which is dispersed on photoresist layer 186.

Ultrasonic generators 475 and 485 are optional, and one or both sets of ultrasonic generators are not present in alternative cleaning heads according to the present invention. Similarly grooves 425, 430 and 435 and inlets 455 and 465 and outlets 460 are not present in alternative cleaning heads according to the present invention.

In a first mode of operation, ultrasonic generators 475 and 485 are powered whenever cleaning fluid is supplied to central opening 410 or groove 420 respectively. In a second mode of operation, ultrasonic energy is only supplied when cleaning fluid is supplied to central opening 410 or groove 420 respectively and wafer 190 is moving relative to cleaning head 400. In a third mode of operation ultrasonic generators 475 are not used. In a fourth mode of operation ultrasonic generators 485 are not used. In a fifth mode of operation ultrasonic generators 475 and 485 are not used.

Figures 11, 12:
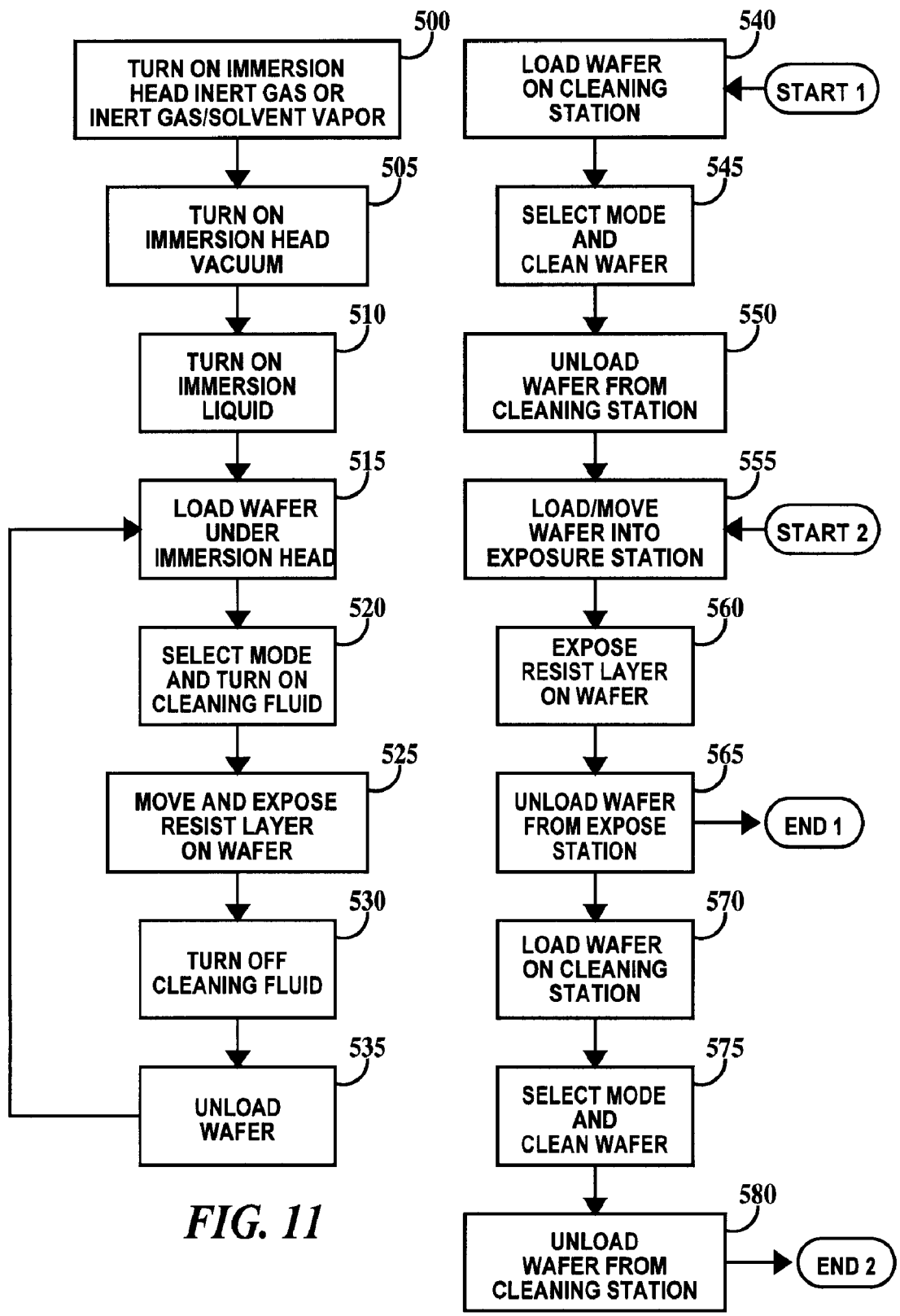
FIG. 11 is a flowchart of the method of cleaning a semiconductor substrate in a immersion lithography system according to the first embodiment of the present invention.
FIG. 12 is a flowchart of the method of cleaning a semiconductor substrate in an immersion lithography system according to the second embodiment of the present invention.

FIG. 11 is a flowchart of the method of cleaning a semiconductor substrate in an immersion lithography system according to the first embodiment of the present invention. In step 500, inlet inert gas or inert gas/solvent vapor mixture is turned on to the immersion head. In step 505, outlet vacuum is turned on to the immersion head. In step 510, immersion fluid is turned on to the immersion head. In step 515, a photoresist-coated wafer is loaded under the immersion head. In step 520, the operational mode(s) is selected and the cleaning fluid(s) and ultrasonic generator(s) turned on based on the selected mode and physical capability of the immersion head as described supra for the first embodiment of the present invention. In step 525, the wafer is moved under the immersion head and the photoresist layer exposed while cleaning according to the mode(s) selected is performed. In step 530, the cleaning fluid(s) is turned off and in step 535 the wafer is unloaded from under the immersion head. Steps 515 through 535 are repeated for each wafer to be exposed.

FIG. 12 is a flowchart of the method of cleaning a semiconductor substrate in an immersion lithography system according to the second embodiment of the present invention. The steps listed below may be performed in the following sequences: 1) steps 540, 545, 550, 555, 560, 565, 570, 575 and 580 (START 1 to END 2); or 2) steps 540, 545, 550, 555, 560 and 565 (START 1 to END 1); or 3) 555, 560, 565, 570, 575 and 580 (START 2 to END 2). In other words, cleaning may be performed before exposure, after exposure, or both before and after exposure.

In step 540, the wafer is loaded into the cleaning station and positioned under the cleaning head. In step 545, the operational mode(s) is selected and the cleaning fluid(s) and ultrasonic generator(s) turned on based on the selected mode and physical capability of the cleaning head as described supra for the second embodiment of the present invention. In step 550, the cleaning fluid(s) is turned off and the wafer is unloaded from under the cleaning head.

In step 555, the photoresist-coated wafer is moved (or loaded if steps 540, 545 and 550 were not performed) under the immersion head. In step 560, the photoresist layer on the wafer is exposed. In step 565, the wafer is unloaded from the exposure station.

In step 570, the exposed wafer is moved to the cleaning station and positioned under the cleaning head (or moved out of the tool if steps 570, 575 and 580 are not to be performed). In step 575, the operational mode(s) is selected and the cleaning fluid(s) and ultrasonic generator(s) turned on based on the selected mode and physical capability of the cleaning head as described supra for the second embodiment of the present invention. In step 580, the cleaning fluid(s) is turned off and the wafer is unloaded from the cleaning station.

In the first embodiment of the present invention, when two cleaning grooves are supplied, photoresist developer may be supplied to the innermost of the two "cleaning" grooves instead of a cleaning fluid in order to develop the latent image formed in the photoresist layer by the exposure process and a rinse solvent may be supplied to the outermost of the two "cleaning" grooves to rinse away the developer and dissolved photoresist.

In the second embodiment of the present invention, when both a central opening and a cleaning groove is supplied, photoresist developer may be supplied to the central opening instead of a cleaning fluid in order to develop the latent image formed in the photoresist layer by the exposure process and a rinse solvent may be supplied the "cleaning" groove to rinse away the developer and dissolved photoresist.

Thus, the present invention provides a method and apparatus for preventing or reducing formation of contaminant residues and for removing contaminant residues formed during immersion lithography.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. For example, while the wafers described in the present invention are circular discs, the present invention is applicable to wafers having other geometric shapes such as squares and rectangles. Therefore, it is intended that the following claims cover all such modifications and changes as fall within the true spirit and scope of the invention.

What is claimed is:

1. An apparatus, comprising:
   a chamber having a top and a sidewall and a bottom opening, said top transparent to selected wavelengths of light;
   an inlet and an outlet in said sidewall of said chamber;
   a plate extending outward from a bottom edge of said chamber;
   a set of concentric grooves formed in a bottom surface of said plate, said grooves centered about said chamber,
   means for applying a vacuum to a first groove and a fourth groove of said set of grooves, said first groove nearest said bottom opening of said chamber;
   means for supplying an inert gas or said inert gas and a solvent vapor mixture to a second groove and a fifth groove of said set of grooves, said second groove between said first and said fourth groove and said fifth groove outside of said fourth groove; and
   means for supplying a cleaning fluid to a third groove of said set of grooves, said third groove between said second groove and said fourth groove.

2. The apparatus of claim 1, further including:
   at least one ultrasonic generator between said third and fourth grooves.

3. The apparatus of claim 1, further including:
   a sixth groove of said set of grooves outside of said fifth groove and means for supplying an additional cleaning fluid to said sixth groove;
   a seventh groove of said set of grooves outside of said sixth groove and means for applying an additional vacuum to said sixth groove; and
   an eighth groove of said set of grooves outside of said seventh groove and means for supplying an additional inert gas or said additional inert gas and an additional solvent vapor mixture to said eighth groove.

4. The apparatus of claim 3, further including:
   at least one ultrasonic generator between said third and fourth grooves.

5. The apparatus of claim 4, further including:
   one or more additional ultrasonic generators between said sixth and seventh grooves.

6. The apparatus of claim 3, further including:
   at least one ultrasonic generator between said sixth and seventh grooves.

7. The apparatus of claim 1, further including:
   a sixth groove of said set of grooves positioned between said fourth groove and said fifth groove and means for supplying an additional cleaning fluid to said sixth groove.

8. The apparatus of claim 7, further including:
   at least one ultrasonic generator between said third and fourth grooves, at least one ultrasonic generator between said fourth and sixth grooves, or at least one ultrasonic generator between said third and fourth grooves and at least one ultrasonic generator between said fourth and sixth grooves.

9. An apparatus, comprising:
   a circular plate and an opening formed in a bottom surface of said plate;
   a set of concentric grooves formed in said bottom surface of said plate, said grooves centered about said opening;
   means for supplying a cleaning fluid to said opening;
   means for applying a vacuum to a first groove of said set of grooves, said first groove closest to said opening; and
   means for supplying an inert gas or said inert gas and a solvent vapor mixture to a second groove of said set of grooves, said second groove outside of said first groove.

10. The apparatus of claim 9, further including:
    a third groove of said set of grooves outside of said second groove and means for supplying an additional cleaning fluid to said third groove;
    a fourth groove of said set of grooves outside of said third groove and means for applying an additional vacuum to said fifth groove; and
    a fifth groove of said set of grooves outside of said fourth groove and means for supplying an additional inert gas or said additional inert gas and an additional solvent vapor mixture to said fifth groove.

11. The apparatus of claim 10, further including:
at least one ultrasonic generator between said opening and said first groove, at least one ultrasonic generator between said third and fourth grooves or at least one ultrasonic generator between said opening and said first groove and at least one ultrasonic generator between said third and fourth grooves.

12. The apparatus of claim 9, further including:
a third groove of said set of grooves between said first and second grooves and means for supplying an additional cleaning fluid to said third groove.

13. The apparatus of claim 12, further including:
at least one ultrasonic generator between said opening and said first groove, at least one ultrasonic generator between said second and third grooves or at least one ultrasonic generator between said opening and said first groove and at least one ultrasonic generator between said second and third grooves.

14. An immersion exposure system for exposing a photoresist layer on a top surface of a wafer to light, comprising:
a light source, one or more focusing lenses, a mask holder, a slit, an immersion head and a wafer stage, said light source, said one or more focusing lenses, said mask holder, said slit, and said immersion head aligned to an optical axis, said wafer stage moveable in two different orthogonal directions, each said orthogonal direction orthogonal to said optical axis, said mask holder and said slit moveable in one of said two orthogonal directions, said immersion head having a chamber having a top, a sidewall and a bottom opening, said top transparent to selected wavelengths of light;
means for filling said chamber of said immersion head with an immersion liquid, said chamber aligned to said optical axis;
means for cleaning a top surface of said photoresist layer; and
wherein said means for cleaning a top surface of said photoresist layer comprises:
a plate extending outward from a bottom edge of said chamber;
a set of concentric grooves formed in a bottom surface of said plate, said grooves centered about said chamber,
means for applying a vacuum to a first groove and a fourth groove of said set of grooves, said first groove nearest said bottom opening of said chamber;
means for supplying an inert gas or said inert gas and a solvent vapor mixture to a second groove and a fifth groove of said set of grooves, said second groove between said first and said fourth groove and said fifth groove outside of said fourth groove; and
means for supplying a cleaning fluid to a third groove of said set of grooves, said third groove between said second groove and said fourth groove.

15. The apparatus of claim 14, further including:
at least one ultrasonic generator between said third and fourth grooves.

16. The apparatus of claim 14, further including:
a sixth groove of said set of grooves outside of said fifth groove and means for supplying an additional cleaning fluid to said sixth groove;
a seventh groove of said set of grooves outside of said sixth groove and means for applying an additional vacuum to said sixth groove; and
an eighth groove of said set of grooves outside of said seventh groove and means for supplying an additional inert gas or said additional inert gas and an additional solvent vapor mixture to said eighth groove.

17. The apparatus of claim 16, further including:
at least one ultrasonic generator between said third and fourth grooves.

18. The apparatus of claim 17, further including:
one or more additional ultrasonic generators between said sixth and seventh grooves.

19. The apparatus of claim 16, further including:
at least one ultrasonic generator between said sixth and seventh grooves.

20. The apparatus of claim 14, further including:
a sixth groove of said set of grooves positioned between said fourth groove and said fifth groove and means for supplying an additional cleaning fluid to said sixth groove.

21. The apparatus of claim 20, further including:
at least one ultrasonic generator between said third and fourth grooves, at least one ultrasonic generator between said fourth and sixth grooves, or at least one ultrasonic generator between said third and fourth grooves and at least one ultrasonic generator between said fourth and sixth grooves.

22. The apparatus of claim 14, wherein said means for cleaning a top surface of said photoresist layer comprises:
a circular plate and an opening formed in a bottom surface of said plate;
a set of concentric grooves formed in said bottom surface of said plate, said grooves centered about said opening;
means for supplying a cleaning fluid to said opening;
means for applying a vacuum to a first groove of said set of grooves, said first groove closest to said opening; and
means for supplying an inert gas or said inert gas and a solvent vapor mixture to a second groove of said set of grooves, said second groove outside of said first groove.

23. The apparatus of claim 22, further including:
a third groove of said set of grooves outside of said second groove and means for supplying an additional cleaning fluid to said third groove;
a fourth groove of said set of grooves outside of said third groove and means for applying an additional vacuum to said fifth groove; and
a fifth groove of said set of grooves outside of said fourth groove and means for supplying an additional inert gas or said additional inert gas and an additional solvent vapor mixture to said fifth groove.

24. The apparatus of claim 23, further including:
at least one ultrasonic generator between said opening and said first groove, at least one ultrasonic generator between said third and fourth grooves or at least one ultrasonic generator between said opening and said first groove and at least one ultrasonic generator between said third and fourth grooves.

25. The apparatus of claim 22, further including:
a third groove of said set of grooves between said first and second grooves and means for supplying an additional cleaning fluid to said third groove.

26. The apparatus of claim 25, further including:
at least one ultrasonic generator between said opening and said first groove, between said second and third grooves or between said opening and said first groove and between said second and third grooves.

* * * * *